United States Patent
Mouret et al.

(10) Patent No.: US 10,496,114 B2
(45) Date of Patent: Dec. 3, 2019

(54) CLOSED-LOOP SYSTEM OSCILLATION DETECTOR

(71) Applicant: NXP USA, Inc., Austin, TX (US)

(72) Inventors: Guillaume Mouret, Toulouse (FR); Matthew Bacchi, Saveres (FR); Pascal Sandrez, Toulouse (FR); Alexis Nathanael Huot-Marchand, Labastidette (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/101,611

(22) Filed: Aug. 13, 2018

(65) Prior Publication Data
US 2019/0109562 A1    Apr. 11, 2019

(30) Foreign Application Priority Data
Oct. 10, 2017    (EP) .................................... 17306367

(51) Int. Cl.
*G05F 1/46* (2006.01)
*G05F 1/565* (2006.01)
*G01R 31/40* (2014.01)

(52) U.S. Cl.
CPC ............... *G05F 1/46* (2013.01); *G01R 31/40* (2013.01); *G05F 1/565* (2013.01)

(58) Field of Classification Search
CPC ............ G05F 1/46; G05F 1/565; G01R 31/40
See application file for complete search history.

(56) References Cited

U.S. PATENT DOCUMENTS

| 8,179,156 B2* | 5/2012 | Horsky | ................. | G01R 31/40 |
| | | | | 324/764.01 |
| 8,237,424 B2 | 8/2012 | Marty-Blavier et al. | | |
| 9,065,460 B1 | 6/2015 | Carnu et al. | | |

* cited by examiner

*Primary Examiner* — Ryan Johnson

(57) ABSTRACT

A detector (110) detects an unwanted oscillation generated by a closed-loop system (112) due to disconnection, improper usage, or absence of a stability-controlling element (104) necessary for the closed-loop system to function properly. An integrated circuit (102) includes the closed-loop system, the detector, and a supervisory system (114) that disables the closed-loop system upon disconnection of the stability-controlling element from the closed-loop system.

20 Claims, 6 Drawing Sheets

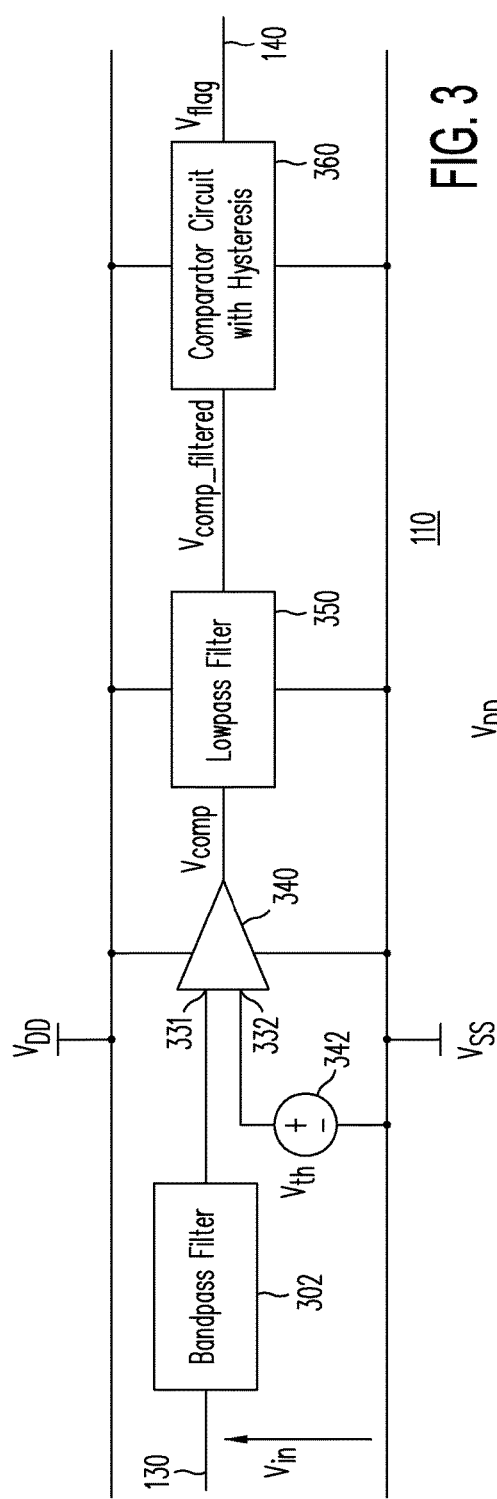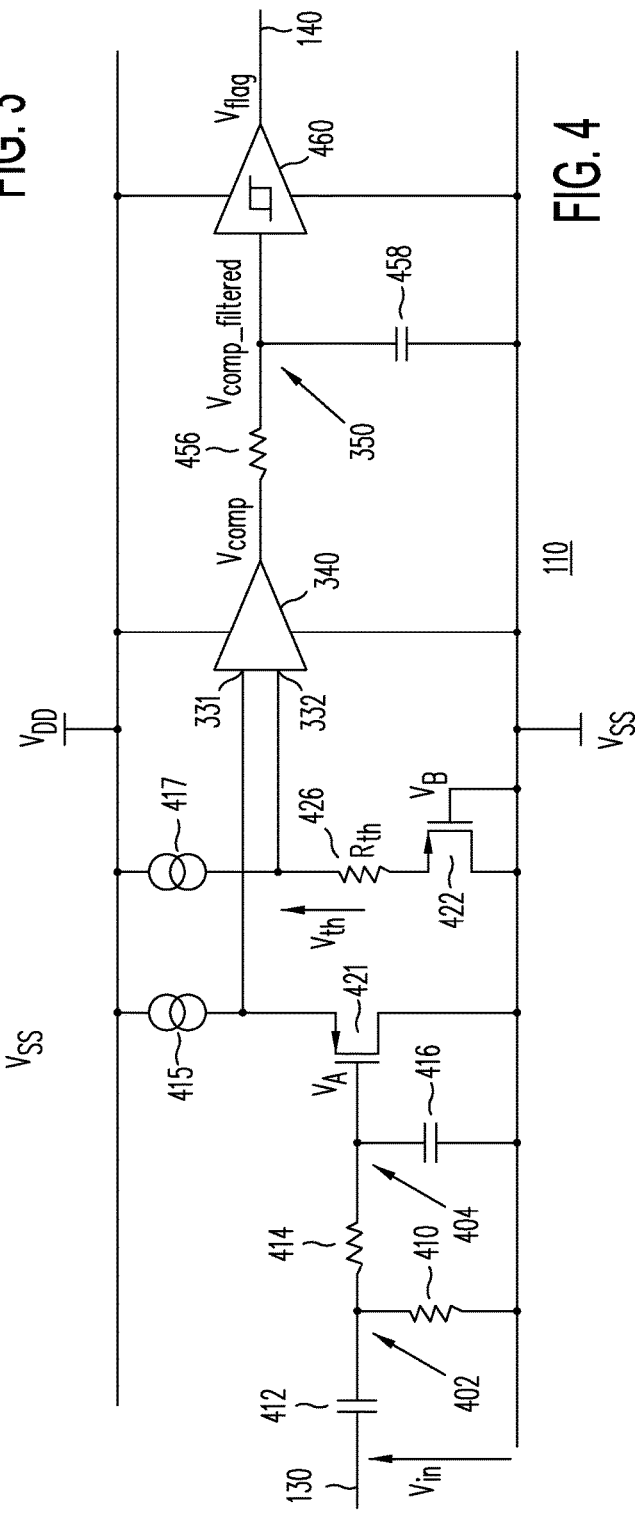

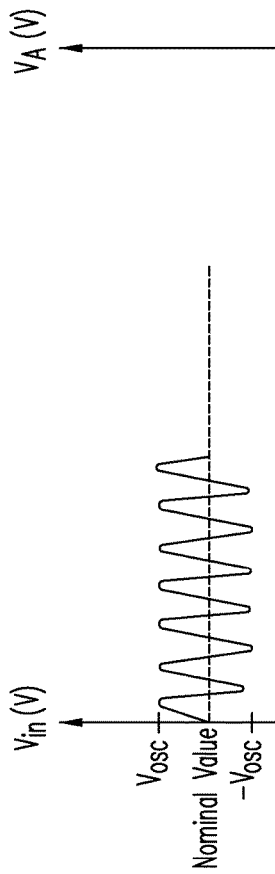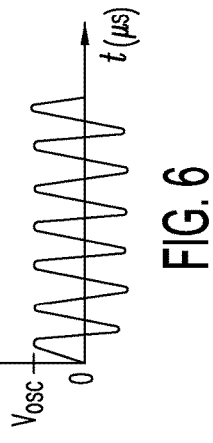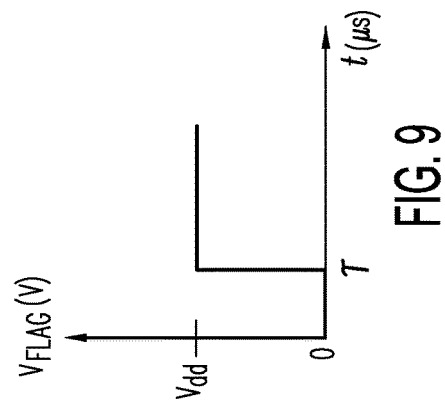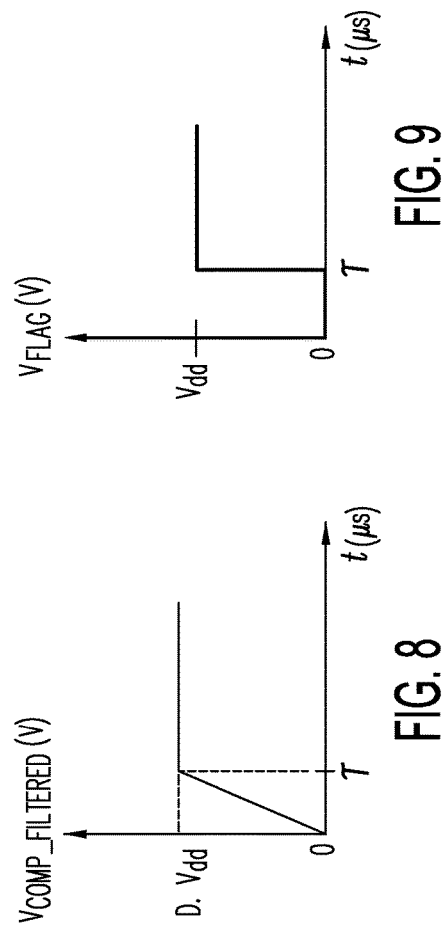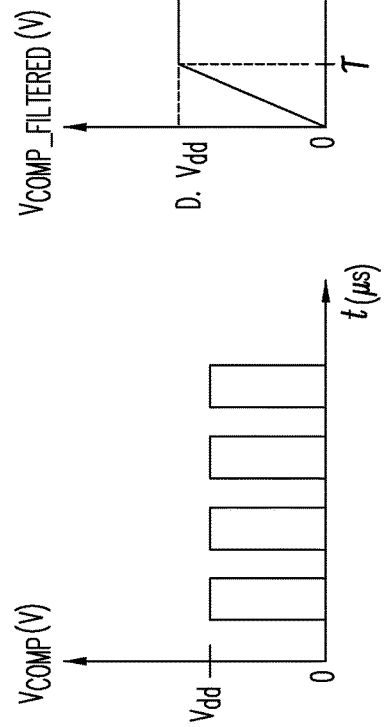

CLOSED-LOOP SYSTEM OSCILLATION DETECTOR

BACKGROUND

Field

This invention relates generally to electronic circuits and more particularly to a circuit that detects oscillation of a closed-loop system.

Related Art

A closed-loop system is a system in which some or all of its output is used as its input. An example of a closed-loop system is a voltage regulator. Most voltage regulators need a regulation loop to keep an output voltage of the voltage regulator stable. The regulation loop usually includes a capacitor. Most integrated circuits include an internal voltage regulator that depends on an external component such as a capacitor to ensure stability. If the capacitor becomes disconnected or is missing, the voltage regulator can oscillate thereby disturbing or even destroying circuits connected to it. One known method of ensuring stability in the case of disconnection of an external capacitor is to use two external capacitors in parallel.

The International Organization for Standardization (ISO) has promulgated an international standard entitled "Road vehicle—Functional safety", ISO 26262, that requires detection of a malfunction of a safety-related electronic or electrical system within a road vehicle. One such malfunction is an unwanted oscillation at an output of a closed-loop system that may occur because of an unanticipated disconnection of an element used for stability of the open-loop system.

PCT Publication No. WO2007082557 A2 by Arlette Marty-Blavier et al., entitled "Regulated Voltage System and Method of Protection Therefor" discloses a system and a method that use a periodic signal to switch off a regulator for short periods. If a capacitor is disconnected from the regulator, a reset circuit detects the disconnection, but only at start-up of the regulator. This system and method is not capable of detecting a disconnection of the capacitor when the disconnection occurs during normal running of the regulator. Disadvantageously, this system and method require that the regulator tolerates a periodic shutdown and an associated voltage drop.

U.S. Pat. No. 9,065,460 B1 by Carnu et al., entitled "External Oscillator Detector" discloses a detector that detects presence of an external oscillating signal that has been intentionally applied to an input of an integrated circuit, and in response, the detector reacts accordingly. Disadvantageously, this detector fails to ignore an oscillating signal that originates from outside the integrated circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 3 is a simplified schematic and block diagram of the closed-loop oscillation detector.

FIG. 4 is a more detailed schematic of one embodiment of the closed-loop oscillation detector.

FIGS. 5-9 are graphs of signals occurring within the closed-loop oscillation detector.

DETAILED DESCRIPTION

A closed-loop oscillation detector in accordance with the invention detects an unwanted oscillation generated by a closed-loop system due to disconnection, improper usage, or absence of an external component used for stability or otherwise necessary for the closed-loop system to function properly.

Figure 1:
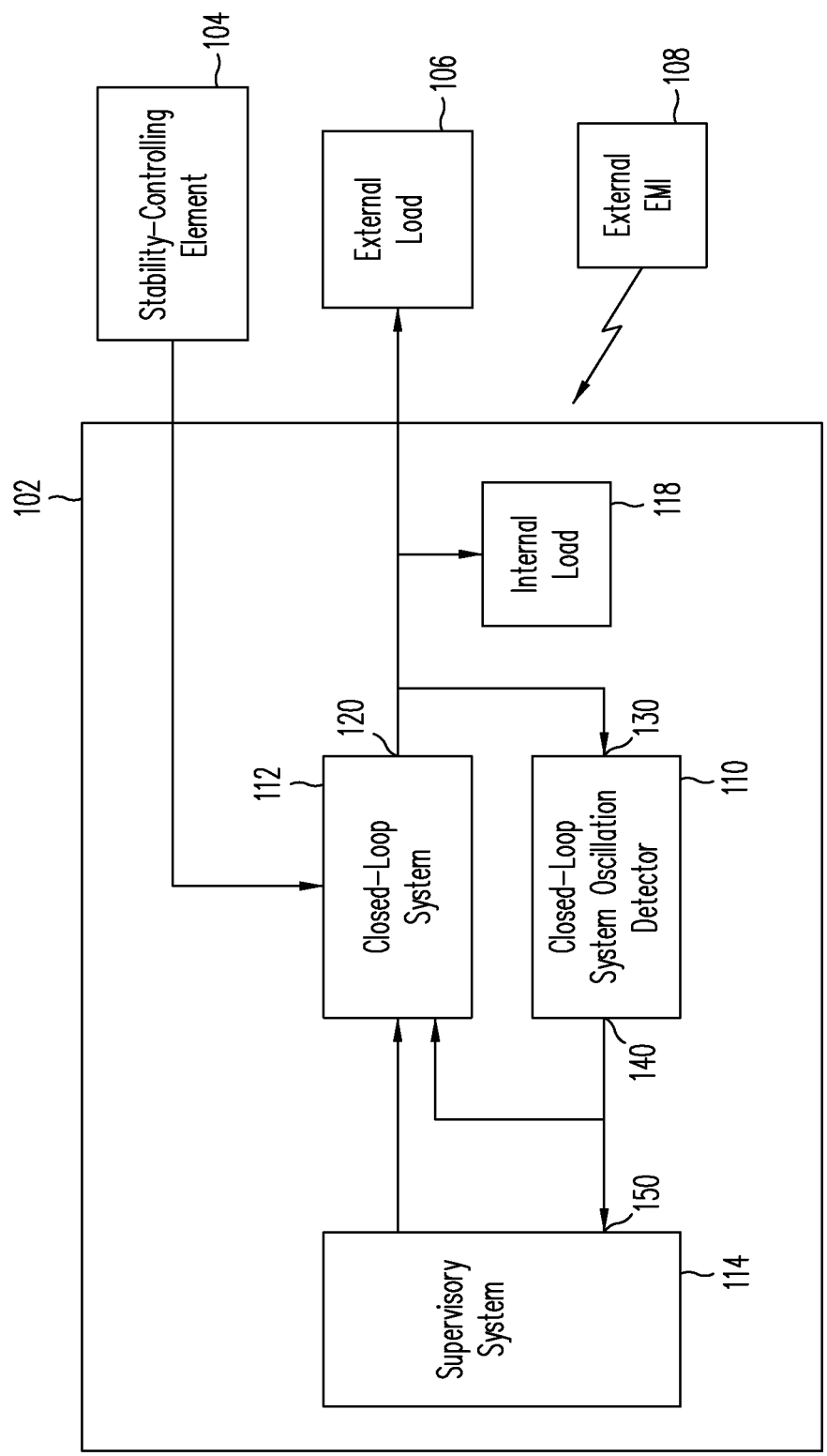
FIG. 1 is a simplified block diagram of an integrated circuit including a closed-loop system oscillation detector in accordance with the invention, and a stability-controlling element and an external load coupled to the integrated circuit, and a representation of one or more sources of electromagnetic interference.

FIG. 1 is a simplified block diagram of an integrated circuit 102 including a closed-loop system oscillation detector (hereinafter "detector") 110 in accordance with the invention, located within the integrated circuit. FIG. 1 also shows a stability-controlling element 104 located external to the integrated circuit 102 and coupled to the integrated circuit, an external load 106 located external to the integrated circuit and coupled to the integrated circuit, and a representation of one or more sources of electromagnetic interference (EMI) 108 emanating from one or more locations external to the integrated circuit.

The circuitry within the integrated circuit 102 includes a closed-loop system 112, a supervisory system 114, and an internal load 118. The stability-controlling element 104 is coupled to the closed-loop system 112. In one embodiment, the closed-loop system 112 includes analog circuitry (not shown) and digital circuitry (not shown). The closed-loop system 112 includes an output terminal 120 coupled to an input terminal 130 of the detector 110 and to one of, or both, the external load 106 and the internal load 118. The detector 110 monitors a signal produced by, or within, the closed-loop system 112. Hereinafter, the signal monitored by the detector 110 is assumed to be an output signal of the closed-loop system 112. The detector 110 includes an output terminal 140 coupled to an input terminal 150 of the supervisory system 114. The supervisory system 114 includes digital logic (not shown). In one embodiment, the supervisory system 114 is a micro-controller. The supervisory system 114 includes an output terminal coupled to the closed-loop system 112.

In one embodiment, the closed-loop system 112 is a voltage regulator, and the stability-controlling element 104 includes a capacitor (not shown). A size of the capacitor that is typically used with a voltage regulator is 100 nF to 10 µF. The capacitor must be external to the integrated circuit 102 because the capacitor that is typically used with a voltage regulator is too large to be integrated into a die. The maximum size of a capacitor that can be integrated into a die is approximately 0.001 µF. Typically, an output voltage of the voltage regulator is between 1V and 5V. In one embodiment, the closed-loop system 112 is a voltage regulator that supplies voltage to one of, or both, the external load 106 and the internal load 118. In one embodiment, the closed-loop system 112 is a voltage regulator that supplies voltage to all circuits (other than the detector 110 and the supervisory system 114) within the integrated circuit 102. In another embodiment, the closed-loop system 112 is a charge pump. However, the closed-loop system 112 is not limited to being either a voltage regulator or a charge pump.

The closed-loop system 112, the detector 110 and the supervisory system 114 may share a same power supply (not shown); however, the voltage that powers the detector 110 and the supervisory system 114 is not regulated by the closed loop system.

The detector 110 detects an unwanted oscillation of the closed-loop system 112 such as may occur when the stability-controlling element 104 is disconnected or missing. Electromagnetic energy emanating from the one or more sources of EMI 108 may be wirelessly received by the closed-loop system 112, and, as a result, may cause an unwanted oscillation of the output signal of the closed-loop system.

Figure 2:
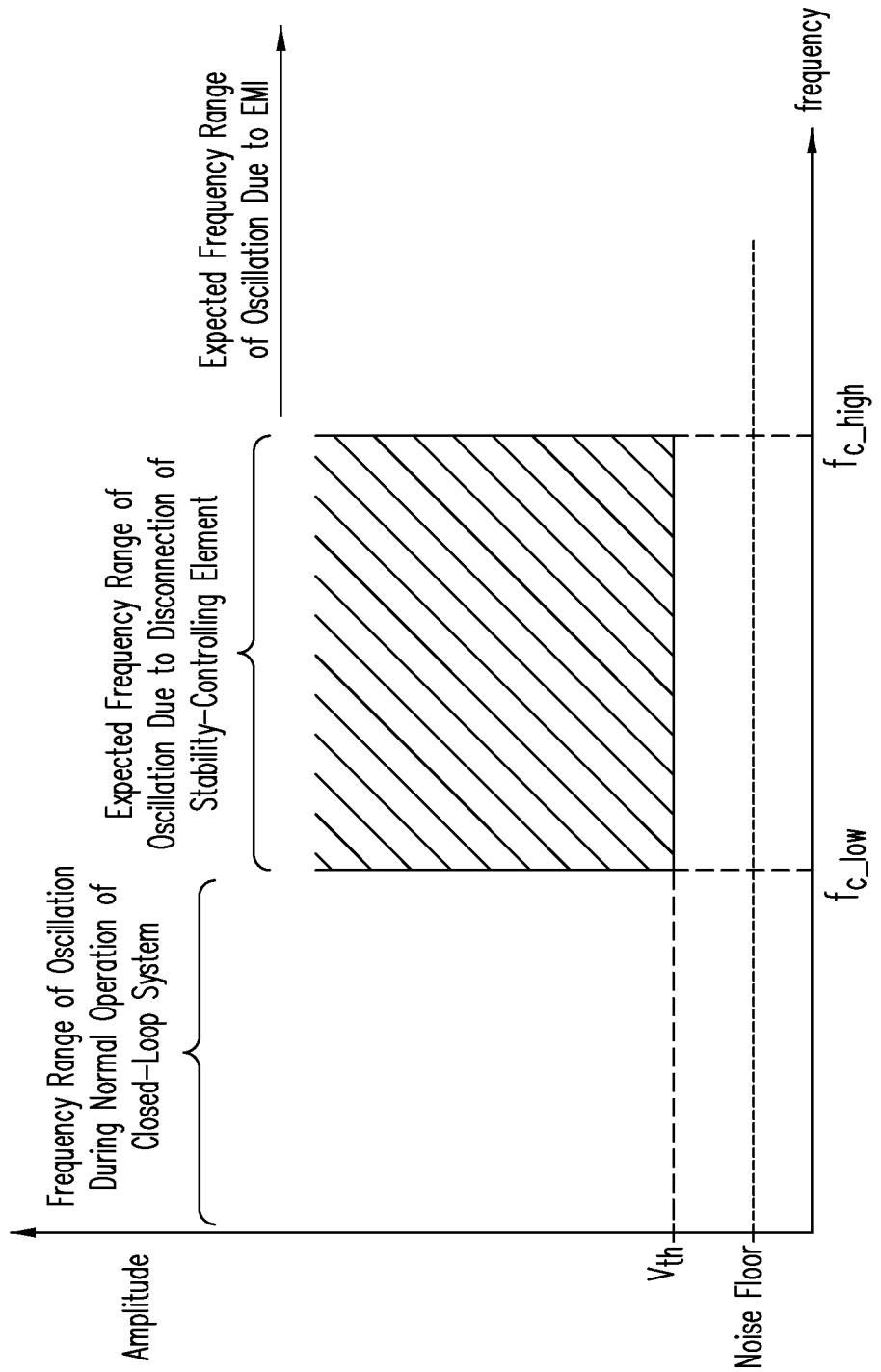
FIG. 2 is a graph that illustrates different input conditions that can be applied to the closed-loop oscillation detector.

FIG. 2 is a graph that illustrates different input conditions that can be applied the detector 110. FIG. 2 illustrates normal functioning, unwanted oscillation and electromagnetic compatibility (EMC) perturbation, as a function of frequency and amplitude. Typically, there is some noise on the output signal of the closed-loop system 112. In the embodiment in which the closed-loop system 112 is a voltage regulator, on each occasion that logic gates in digital circuits within the integrated circuit 102 switch states, there is a demand for current from the voltage regulator that causes an oscillation of the output voltage of the voltage regulator. In one embodiment, the output voltage of the voltage regulator is 1.6V, and the output voltage of the voltage regulator may oscillate with an amplitude of 5 mV and at a frequency equal to a clocking rate of the logic gates. Such oscillation is considered to be a noise floor of the voltage regulator.

The detector 110 detects unwanted oscillations that have an amplitude greater than a threshold voltage $V_{th}$ (see FIG. 3). Oscillations that have an amplitude less than $V_{th}$ are advantageously ignored by the detector 110 regardless of the frequency of the oscillations. The value of $V_{th}$ is chosen to be higher than an average value of the noise floor of the closed-loop system 112. In the one embodiment in which the noise floor is 5 mV, the value of $V_{th}$ is, for example, chosen to be 50 mV. Oscillations that have an amplitude greater than $V_{th}$ are one of detected and ignored by the detector 110 depending upon the frequency of the oscillations.

The detector 110 includes a band-pass filter 302 (see FIG. 3). The frequency $f_c\_low$ is a lower cut-off frequency of the band-pass filter 302. The frequency $f_c\_low$ defines a system bandwidth of the closed-loop system 112. The frequency $f_c\_high$ is a higher cut-off frequency of the band-pass filter 302. The frequency $f_c\_high$ is a highest expected oscillation frequency of the closed-loop system 112 caused by disconnection of the stability-controlling element 104. The value of $f_c\_high$ depends on a gain bandwidth of a feedback loop of the closed-loop system 112. The band-pass filter 302 attenuates frequencies higher than $f_c\_high$ because such higher frequencies usually correspond to EMC perturbations. When the closed-loop system 112 functions properly, any oscillation, or "ringing", of the output signal of the closed-loop system is below $f_c\_low$. The detector 110 ignores the direct current (DC) component of the output signal of the closed-loop system 112. Advantageously, the detector 110 also ignores any oscillation of the output signal of the closed-loop system 112 below $f_c\_low$. Therefore, the detector 110 ignores most transients and voltage overshoots in the output signal of the closed-loop system 112. If the stability-controlling element 104 is disconnected, the closed-loop system 112 may oscillate about its nominal value with amplitude $V_{osc}$ and frequency $f_{osc}$. The expected oscillation frequency $f_{osc}$ of the closed-loop system 112 due to disconnection of the stability-controlling element 104 is between $f_c\_low$ and $f_c\_high$. Any oscillation of the output signal of the closed-loop system 112 caused by an EMC perturbation is above $f_c\_high$. The frequency thresholds, $f_c\_low$ and $f_c\_high$, of the detector 110 are adjustable to accommodate parameters of the closed-loop system 112.

FIG. 3 is a simplified schematic and block diagram of the detector 110. A purpose of the detector 110 is to monitor the output voltage of the closed-loop system 112 during normal operation of the closed-loop system. The detector 110 detects an oscillation of an input signal $V_{in}$ (see FIG. 5) having a frequency within the range of the band-pass filter 302, and having an amplitude higher than a threshold voltage $V_{th}$ and having a duration longer than a predefined duration. The predefined duration of oscillation is a design choice dependent upon a purpose of the integrated circuit 102. Parameters of the detector 110 (such as frequency range of oscillation, amplitude of oscillation, and duration of oscillation) are adjustable to accommodate parameters of the closed-loop system 112.

An input terminal 130 of the detector 110 is coupled to the closed-loop system 112. The detector 110 receives the output voltage of the closed-loop system 112 as the input signal $V_{in}$ of the detector. The input signal $V_{in}$ is a direct current (DC) voltage having a nominal value. In one embodiment, the nominal value of the DC voltage is 1.6V. The detector 110 includes a band-pass filter 302 having an input terminal coupled to the input terminal 130 of the detector and having an output terminal. The band of the band-pass filter 302 is adapted to match the parameters of the closed-loop system 112. In one embodiment, the band of the band-pass filter 302 is 10 kHz to 10 MHz. The output terminal of the band-pass filter 302 is coupled to a first input terminal 331 of a voltage comparator (hereinafter "comparator") 340. The band-pass filter 302 removes from $V_{in}$ frequency components below $f_c\_low$ and frequency components above $f_c\_high$. Of course, the band-pass filter 302 also removes a direct current (DC) component from $V_{in}$. The output terminal of the band-pass filter 302 supplies a voltage $V_A$ (see FIG. 6) to the first input terminal 331 of the comparator 340. A voltage source 342 is coupled to a second input terminal 332 of the comparator 340. The voltage source 342 supplies a threshold voltage $V_{th}$ to the second input terminal 332 of the comparator 340. The threshold voltage $V_{th}$ is adapted to match parameters of the closed-loop system 112. An amplitude of an alternating current (AC) component of $V_{in}$ is compared to $V_{th}$. More specifically, the comparator 340 compares $V_A$ to $V_{th}$. If and $V_A$ is higher than $V_{th}$, the comparator 340 generates a square signal $V_{comp}$ (see FIG. 7). A maximum voltage of $V_{comp}$ is $V_{dd}$ of the detector 110. An output terminal of the comparator 340 is coupled to a final low-pass filter 350.

The final low-pass filter 350 outputs a signal $V_{comp\_filtered}$, which is an average value of $V_{comp}$. The average value of $V_{comp}$ depends on a duty-cycle of $V_{comp}$. The duty-cycle of $V_{comp}$ depends on the value of $V_{th}$. The voltage of $V_{comp\_filtered}$ is determined by $V_{dd}$ multiplied by the duty-cycle of $V_{comp}$, which is labeled $D \cdot V_{dd}$ in FIG. 8. The higher is $V_{th}$, the lower is $D \cdot V_{dd}$. Because the output of the final low-pass filter 350 contains a small ripple, the output terminal of the final low-pass filter 350 is coupled to the comparator circuit with hysteresis 360. An output signal from the comparator circuit with hysteresis 360 is $V_{flag}$. The signal $V_{flag}$ is maintained at $V_{dd}$ after a first occasion that $V_{comp\_filtered}$ reaches a pre-defined threshold. The pre-defined duration is determined by the final low-pass filter 350.

In one embodiment, the output terminal of the comparator circuit with hysteresis 360 is coupled to the input terminal 150 of the supervisory system 114. In case of the disconnection of the stability-controlling element 104, the detector 110 generates the signal $V_{flag}$ that is processed by the supervisory system and causes the supervisory system to enter a safe mode. In another embodiment, the output terminal of the comparator circuit with hysteresis 360 is coupled directly to the closed-loop system 112, and the signal $V_{flag}$ causes the supervisory system 114 to enter a safe mode. In yet another embodiment, the comparator circuit with hysteresis 360 is coupled to the input terminal 150 of the supervisory system 114 and is also coupled directly to the closed-loop system 112. In the case of the voltage regulator example of the closed-loop system 112, a logical "1" $V_{flag}$ immediately disables the voltage regulator thereby preventing damage to the external load 106 and/or the internal load 118, and the logical "1" $V_{flag}$ informs the supervisory system 114 that a malfunction has been detected.

FIG. 4 is a more detailed schematic of one embodiment of one embodiment of the detector 110. The detector 110 includes a high-pass filter 402 and a low-pass filter 404. An input terminal of the high-pass filter 402 is coupled to the input terminal 130 of the detector 110. The high-pass filter 402 removes a DC component of an output signal of the closed-loop system 112 leaving only an AC component of the output signal of the closed-loop system 112. In one embodiment, the high-pass filter 402 comprises resistor 410 and capacitor 412. The frequency threshold, $f_c\_low$, of the detector 110 is adapted to match the parameters of the closed-loop system 112 by selecting values of the components of the high-pass filter 402. In one embodiment, a value of resistor 410 is 1.6 MΩ, and a value of capacitor 412 is 10 pF. The lowest possible value of $f_c\_low$ is limited by the largest size of capacitor 412 that can be integrated in a die. Typically, $f_c\_low$ is 10 kHz to 100 kHz. In one embodiment, $f_c\_low$ is approximately 50 kHz. Advantageously, the detector 110 does not affect the output of the closed-loop system 112 because the input capacitance of the detector is very small compared to the output capacitance of the closed-loop system. The value of $V_{in}$ that can be successfully inputted into the detector 110 is limited only by the technology used to fabricate capacitor 412. The detector 110 can properly detect any oscillations of the output voltage of the closed-loop system 112 regardless of amplitude of the oscillations, including oscillations larger than $V_{dd}$, limited only by the oscillations being within the voltage limitations of the components of the detector.

An input terminal of the low-pass filter 404 is coupled to an output terminal of the high-pass filter 402 in a series configuration. In one embodiment, the low-pass filter 404 comprises resistor 414 and capacitor 416. The frequency threshold, $f_c\_high$, of the detector 110 is adapted to match the parameters of the closed-loop system 112 by selecting values of the components of the low-pass filter 404. In one embodiment, a value of resistor 414 is 160 kΩ, and a value of capacitor 416 is 100 fF. In one embodiment, $f_c\_high$ is approximately 10 MHz. The low-pass filter 404 removes high frequency signals, such as caused by an electromagnetic perturbation, that are higher than the highest expected oscillation frequency of the output of the closed-loop system 112 caused by disconnection of the stability-controlling element 104. Oscillations caused by EMC perturbations are typically between 1 MHz and 1 GHz.

The detector 110 includes a transistor 421 having a first conducting electrode coupled to ground, a control electrode coupled to an output of the low-pass filter 404 and a second conducting electrode coupled to a current source 415. The input signal $V_{in}$ is composed of an average DC value (for example, 1.6V) plus an oscillation about the average DC value. Because the high-pass filter 402 eliminates the average DC value of $V_{in}$, the detector 110 can compare the value of $V_{in}$ with respect to ground. The low-pass filter 404 attenuates frequencies of $V_{in}$ that are above $f_c\_high$. $V_A$ is the AC component of $V_{in}$ up to $f_c\_high$. The signal $V_A$ is presented to the control electrode of transistor 421. The second conducting electrode of transistor 421 is coupled to a first input terminal 331 of the comparator 340.

The detector 110 includes a transistor 422 having a first conducting electrode coupled to ground, a control electrode coupled to ground and a second conducting electrode coupled to one terminal of a threshold resistor 426. In one embodiment, transistor 421 and transistor 422 are of equal size. Transistor 421 and transistor 422 compose a matched pair to avoid an offset voltage between the two input terminals of the comparator 340. In one embodiment, transistor 421 and transistor 422 are p-channel metal-oxide-semiconductor field-effect transistors (PMOS transistors). Any such offset voltage would detrimentally be added to the voltage threshold $V_{th}$ that was chosen by design. Another terminal of the threshold resistor 426 is coupled to a current source 417. In one embodiment, current source 415 and current source 417 are of equal size. Typically, a value of current source 415 and current source 417 is 5 μA to 10 μA. The signal $V_A$ is compared to a signal $V_B$. The signal $V_B$ is 0V because there is no DC component on the remaining signal $V_A$ at the output of the high-pass filter 402. The threshold voltage $V_{th}$ is created by adding the threshold resistor 426 in series with the second conducting electrode of transistor 422 to create a voltage drop $V_{th}=R_{th}\times I$. The threshold voltage $V_{th}$ of the detector 110 is adapted to match the parameters of the closed-loop system 112 by selecting a value of $R_{th}$. In one embodiment, the value of $R_{th}$ is 3 kΩ, and the value of $V_{th}$ is 30 mV. Once filtered, the amplitude of the AC component of $V_{in}$ is compared to $V_{th}$. During the time that the amplitude of the AC component of $V_{in}$, i.e., $V_A$, is higher than $V_{th}$, the comparator 340 generates a square signal $V_{comp}$. (See FIG. 7.) A maximum voltage of $V_{comp}$ is $V_{dd}$ of the detector 110. An output terminal of the comparator 340 is coupled to the final low-pass filter 350. In one embodiment, the detector 110 includes an inverter (not shown) coupled between the output terminal of the comparator 340 and the final low-pass filter 350. The final low-pass filter 350 includes a resistor 456 and a capacitor 458. In one embodiment, a value of resistor 456 is 2 MΩ, and a value of capacitor 458 is 2 pF. If $V_A$ is greater than $V_{th}$, the comparator 340 outputs the square signal $V_{comp}$ having an amplitude $V_{dd}$ and having a frequency of the signal $V_A$. The square signal $V_{comp}$ slowly charges capacitor 458. A time constant τ of the final low-pass filter 350 determines the predefined duration of oscillation necessary to be considered a malfunction. In one embodiment, τ=4 μsec. In one embodiment, the predefined duration of oscillation is 1 μsec to 10 μsec. The final low-pass filter 350 acts as a delay filter. The duration of oscillation is used to distinguish between a load transient on the closed-loop system 112 and oscillation of the closed-loop system due to disconnection of the stability-controlling element 104. In one embodiment, the pre-defined threshold is 550 mV. In the illustrated embodiment, the comparator circuit with hysteresis 360 is a Schmitt trigger 460. In the illustrated embodiment, a threshold of the Schmitt trigger 460 is 550 mV. A value of the threshold of the Schmitt trigger 460 depends on the amplitude of the input signal $V_{in}$ that the detector 110 is designed to detect. The Schmitt trigger 460 outputs a signal $V_{flag}$. A voltage of a logical "1" of $V_{flag}$ is $V_{dd}$ of the detector 110. A voltage of a logical "0" of $V_{flag}$ is 0V. In one embodiment, a logical "1" of $V_{flag}$ indicates oscillation in the closed-loop system 112 at the frequency, amplitude and duration consistent with the parameters of the detector 110. In one embodiment, the detector 110 includes a buffer (not shown) coupled to an output terminal of the Schmitt trigger 460, and a capacitor (not shown) coupled between an output terminal of the buffer and ground.

In one embodiment, the output terminal of the Schmitt trigger 460 is coupled to the input terminal 150 of the supervisory system 114, and, in case of the disconnection of the stability-controlling element 104, the detector 110 generates a signal $V_{flag}$ that is processed by the supervisory system and causes the supervisory system to enter a safe mode. In another embodiment, the output terminal of the Schmitt trigger 460 is coupled directly to the closed-loop system 112, and the signal $V_{flag}$ causes the supervisory system 114 to enter a safe mode. In yet another embodiment, the output terminal of the Schmitt trigger 460 is coupled to the input terminal 150 of the supervisory system 114 and is also coupled directly to the closed-loop system 112. In the case of the voltage regulator example of the closed-loop system 112, the logical "1" $V_{flag}$ immediately disables the voltage regulator thereby preventing damage to the external load 106 and/or the internal load 118, and the logical "1" $V_{flag}$ informs the supervisory system 114 that a malfunction has been detected.

In the schematics shown in FIGS. 3 and 4, it is assumed that $V_{ss}$ for the detector 110 and $V_{ss}$ for the closed-loop system 112 are at a same potential, such as ground potential. However, in the schematics shown in FIGS. 3 and 4, it is not necessary that $V_{dd}$ for the detector 110 and $V_{dd}$ for the closed-loop system 112 be at a same potential. Nevertheless, in one embodiment, $V_{dd}$ is for both the detector 110 and the closed-loop system 112 is 1.6V. The value of $V_{dd}$ of the detector 110 does not place any limitation on the average value of $V_{in}$ that can be inputted into the detector because the high-pass filter 402 eliminates any direct current value of $V_{in}$.

FIGS. 5-9 are graphs of idealized representative signals occurring within the closed-loop oscillation detector. FIG. 5 shows a representative AC input signal $V_{in}$ of the detector 110, which was outputted by the closed-loop system 112. The output of the closed-loop system 112 has a nominal value. The nominal value is typically between 1V and 5V. In one embodiment, the nominal value is 1.6V. FIG. 6 shows a representative signal $V_A$. FIG. 7 shows a representative signal $V_{comp}$. FIG. 8 shows a representative signal $V_{comp\_filtered}$. FIG. 9 shows a representative signal $V_{flag}$.

The detector 110 has been fully simulated with $V_{th}$ set at 50 mV and with the threshold of the Schmitt trigger 460 set at 550 mV.

Figure 10:
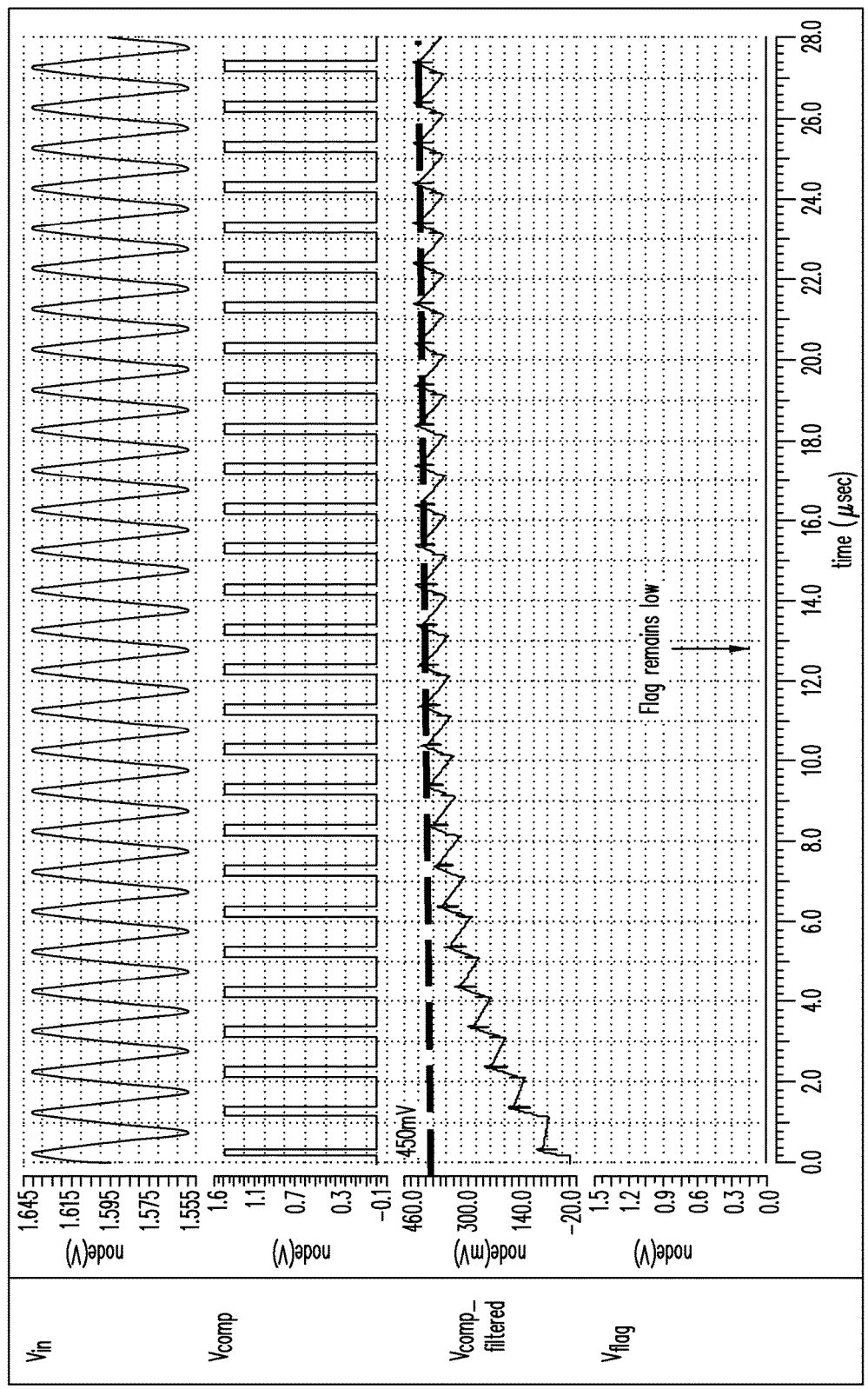
FIG. 10 a set of graphs that show signals associated with a simulation of the closed-loop oscillation detector.

FIG. 10 a set of graphs that show signals associated with a simulation of the detector 110. FIG. 10 shows signals associated with a simulation of the detector 110 with a nominal value of input signal $V_{in}$ of 1.6V and an oscillation voltage $V_{osc}$ around $V_{in}$ of ±40 mV. FIG. 10 shows that $V_{comp\_filtered}$ has a ripple of approximately 20 mV. The simulation results show that for $V_{osc}$=40 mV the flag remains at logical "0" because, even after multiple oscillations, $V_{comp\_filtered}$ only reaches approximately 450 mV whereas the threshold of the Schmitt trigger 460 is set at 550 mV which is higher than 450 mV.

Figure 11:
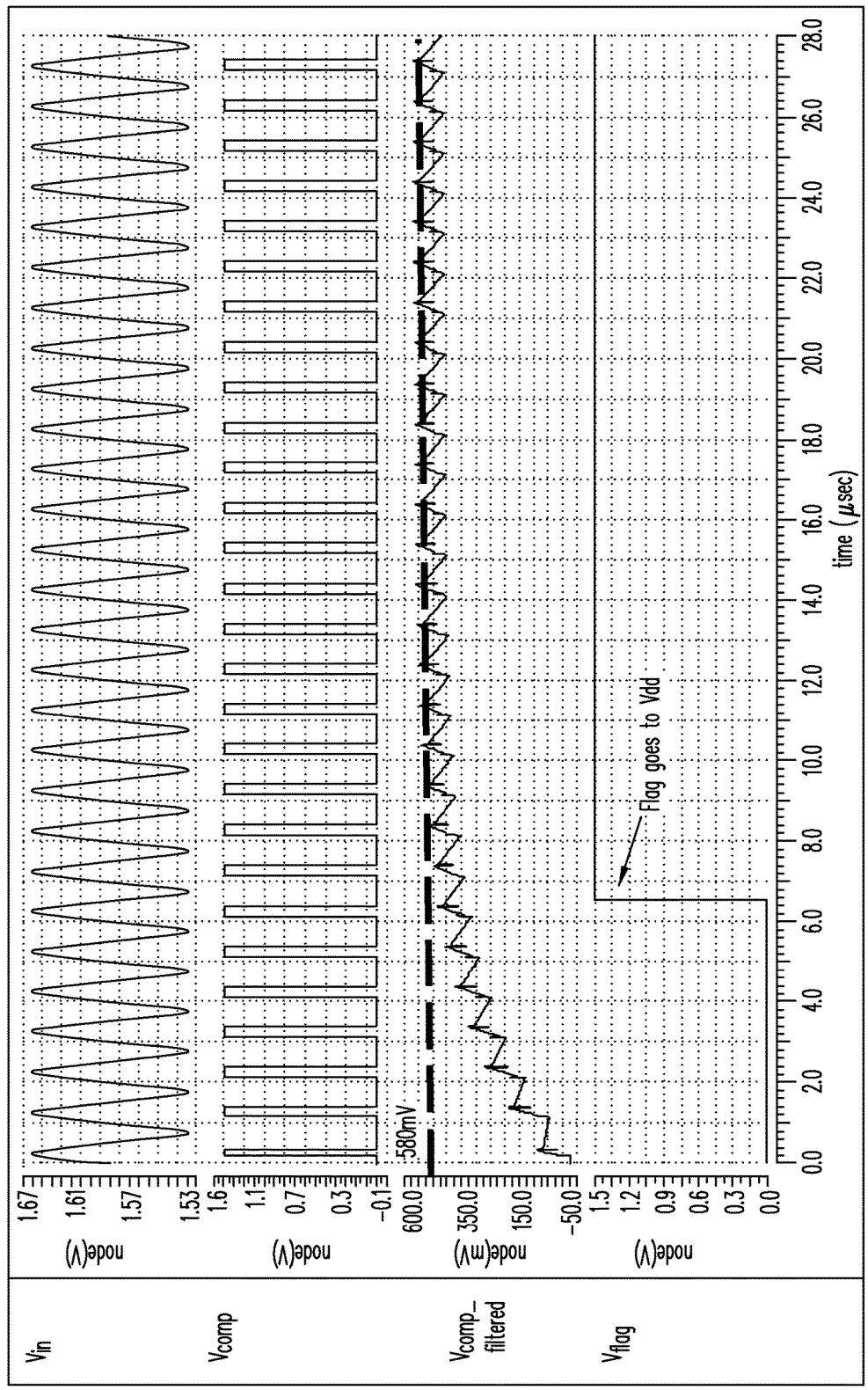
FIG. 11 is a set of graphs that show signals associated with another simulation of the closed-loop oscillation detector.

FIG. 11 is a set of graphs that show signals associated with another simulation of the detector 110. FIG. 11 shows signals associated with a simulation of the detector 110 with a nominal value of input signal $V_{in}$ of 1.6V and an oscillation voltage $V_{osc}$ around $V_{in}$ of ±60 mV. FIG. 11 shows that $V_{comp\_filtered}$ has a ripple of approximately 20 mV. The simulation results show that for $V_{osc}$=60 mV the flag, $V_{flag}$, goes to logical "1" because, after several oscillations, $V_{comp\_filtered}$ reaches approximately 580 mV which is above the threshold of the Schmitt trigger 460 which is set at 550 mV.

The simulation results shown in FIGS. 10 and 11 demonstrate that the detector 110 works well in detecting oscillations of $V_{in}$ above approximately 50 mV.

The detector 110 does not require that the closed-loop system 112 be periodically turned off and on to detect oscillations in the closed-loop system. Advantageously, the detector 110 can detect oscillations in the closed-loop system 112 during normal operation of the closed-loop system.

In one embodiment, the detector 110 is used in an automobile. In one embodiment, the purpose of the integrated circuit 102 is as a fuel injector driver in an automobile. In other embodiments, the purpose of the integrated circuit 102 is to control the braking, the air bags, the power steering or the electronic stability control (ESC) in an automobile. In still further embodiments, the purpose of the integrated circuit 102 is to control other safety functions in any type of vehicle. However, the integrated circuit 102 and the detector 110 are not limited for use within a vehicle.

Electronic systems designed for automobiles, as well as for many other applications, must be tolerant to interference induced by EMI. Examples of the one or more sources of EMI 108 emanating from outside the integrated circuit 102 that may be received by the detector 110 are Bluetooth®, WiFi, cellphones and other wireless technologies, radar, remote entry technology, third-party navigation and high-power transmitters such as for television and broadcast radio. EMI emanating from other circuit blocks (not shown) inside the integrated circuit 102 may also be received by the detector 110. Advantageously, the detector 110 includes filters to help discriminate against an externally applied oscillating signal caused by EMI.

The detector 110 can be used with any known closed-loop system. In one embodiment, the detector 110 is an add-on to a closed-loop system. Advantageously, the detector 110 does not require modification of a closed-loop system to which it is added.

In another embodiment (not shown), the stability-controlling element 104 is located within the integrated circuit 102.

In yet another embodiment (not shown), the detector 110 is located outside an integrated circuit that contains the closed-loop system 112.

The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims.

The Detailed Description section, and not the Abstract section, is intended to be used to interpret the claims. The Abstract section may set forth one or more but not all embodiments of the invention, and the Abstract section is not intended to limit the invention or the claims in any way.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements.

Note that the term "couple" has been used to denote that one or more additional elements may be interposed between two elements that are coupled. The term "coupled", as used herein, is defined as "connected", and encompasses the coupling of devices that may be physically, electrically or communicatively connected (according to context), although the coupling may not necessarily be directly, and not necessarily be mechanically. The term "coupled", as used herein, is not intended to be limited to a direct coupling or a mechanical coupling, and that one or more additional elements may be interposed between two elements that are coupled.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages or solutions to problems that are described herein with regard to specific embodiments are not intended to be construed as a critical, required, or essential feature or element of any or all the claims.

What is claimed is:

1. A circuit, comprising:
a stability-controlling element; and
an integrated circuit coupled to the stability-controlling element, the integrated circuit including a closed-loop system that produces a signal and a detector for detecting oscillation of the signal, the detector including:
a band-pass filter having an input terminal for receiving the signal, and having an output terminal;
a voltage source for producing a threshold voltage;
a voltage comparator having a first input terminal coupled to the output terminal of the band-pass filter, and having a second input terminal coupled to the voltage source;
a low-pass filter having an input terminal coupled to the output terminal of the voltage comparator, and having an output terminal; and
a comparator circuit with hysteresis having an input terminal coupled to the output terminal of the low-pass filter, and having an output terminal,
wherein the output terminal of the comparator circuit with hysteresis produces a flag when the signal oscillates provided that:
a frequency of oscillation of the signal is within a band-pass of the band-pass filter,
an amplitude of oscillation of the signal is greater than the threshold voltage, and
a duration of oscillation of the signal is longer than a time constant of the low-pass filter.

2. The circuit of claim 1, wherein the stability-controlling element is inside the integrated circuit.

3. The circuit of claim 1, wherein the stability-controlling element is outside the integrated circuit.

4. The circuit of claim 1, wherein the stability-controlling element includes a capacitor.

5. The circuit of claim 1, wherein the integrated circuit includes a supervisory system having an input terminal coupled to the detector and having an output terminal coupled to the closed-loop system.

6. The circuit of claim 5, wherein the supervisory system disables the closed-loop system in response to occurrence of the flag.

7. The circuit of claim 1, wherein the output terminal of the comparator circuit with hysteresis is coupled to the closed-loop system.

8. The circuit of claim 7, wherein the detector disables the closed-loop system in response to occurrence of the flag.

9. A circuit, comprising:
a detector for detecting an unwanted oscillation of a closed-loop system, the detector including:
a first high-pass filter having an input terminal for receiving a signal from the closed-loop system and having an output terminal;
a low-pass filter having an input terminal and an output terminal, the input terminal coupled to the output terminal of the first high-pass filter;
a first transistor having a control electrode coupled to the output terminal of the low-pass filter, a first conducting electrode coupled to a first current source coupled to $V_{dd}$, and a second conducting electrode coupled to $V_{ss}$;
a second transistor having a control electrode coupled to $V_{ss}$, a first conducting electrode coupled to one terminal of a resistor, and a second conducting electrode coupled to $V_{ss}$, wherein another terminal of the resistor is coupled to a second current source coupled to $V_{dd}$, wherein a threshold voltage appears across the terminals of the resistor, where the first current source is equal to the second current source, and wherein the first transistor and the second transistor are matched;
a voltage comparator having a first input terminal coupled to the first current source, a second input terminal coupled to the second current source and having an output terminal;
a final low-pass filter having an input terminal coupled to the output terminal of the voltage comparator, and having an output terminal, the final low-pass filter having a time constant; and
a Schmitt trigger having an input terminal coupled to the output terminal of the final low-pass filter, and having an output terminal,
wherein the output terminal of the Schmitt trigger produces a voltage corresponding to a logical "1" based on at least one of:
a frequency of oscillation of the signal,
an amplitude of oscillation of the signal, and
a duration of oscillation of the signal.

10. The circuit of claim 9 including a stability-controlling element, wherein the signal does not oscillate when the stability-controlling element is coupled to the closed-loop system and wherein the signal oscillates when the stability-controlling element is disconnected from the closed-loop system.

11. The circuit of claim 10, wherein the stability-controlling element includes a capacitor coupled between the closed-loop system and $V_{ss}$.

12. The circuit of claim 9, wherein the first high-pass filter has a cut-off frequency $f_c\_high$ and the low-pass filter has a cut-off frequency $f_c\_low$, and wherein the output terminal of the Schmitt trigger produces a voltage corresponding to a logical "1" only when a frequency of oscillation of the signal is between $f_c\_high$ and $f_c\_low$.

13. The circuit of claim 9, wherein the output terminal of the Schmitt trigger produces a voltage corresponding to a logical "1" only when an amplitude of oscillation of the signal is greater than the threshold voltage.

14. The circuit of claim 9, wherein the output terminal of the Schmitt trigger produces a voltage corresponding to a logical "1" only when a duration of oscillation of the signal is longer than a time constant of the final low-pass filter.

15. An integrated circuit, comprising:
a closed-loop system; and
a detector coupled to the closed-loop system, the detector including:
a band-pass filter having an input terminal for receiving a signal from the closed-loop system, and having an output terminal;
a voltage source for producing a threshold voltage;
a voltage comparator having a first input terminal coupled to the output terminal of the band-pass filter, and having a second input terminal coupled to the voltage source;
a low-pass filter having an input terminal coupled to the output terminal of the voltage comparator, and having an output terminal, the low-pass filter having a time constant; and
a comparator circuit with hysteresis having an input terminal coupled to the output terminal of the low-pass filter, and having an output terminal coupled to an output terminal of the detector,
wherein the output terminal of the comparator circuit with hysteresis produces a flag when the signal oscillates provided that:
a frequency of oscillation of the signal is within a band-pass of the band-pass filter,
an amplitude of oscillation of the signal is greater than the threshold voltage, and
a duration of oscillation of the signal is greater than a time constant of the low-pass filter.

16. The integrated circuit of claim 15, including a stability-controlling element coupled to the closed-loop system.

17. The integrated circuit of claim 16, wherein the stability-controlling element includes a capacitor.

18. The integrated circuit of claim 16, including a supervisory system having an input terminal coupled to the output terminal of the detector and having an output terminal coupled to an input terminal of the closed-loop system.

19. The integrated circuit of claim 18, wherein the supervisory system disables the closed-loop system in response to the flag.

20. The integrated circuit of claim 16, wherein the output terminal of the detector is coupled to an input terminal of the closed-loop system, and wherein the detector disables the closed-loop system upon occurrence of the flag.

* * * * *